United States Patent [19]
Tepman et al.

[11] Patent Number: 6,045,620
[45] Date of Patent: Apr. 4, 2000

[54] TWO-PIECE SLIT VALVE INSERT FOR VACUUM PROCESSING SYSTEM

[75] Inventors: Avi Tepman, Cupertino; Robert B. Lowrance, Los Gatos, both of Calif.

[73] Assignee: Applied Materials, Inc., Santa Clara, Calif.

[21] Appl. No.: 08/893,813

[22] Filed: Jul. 11, 1997

[51] Int. Cl.[7] .................................................. C23C 16/00
[52] U.S. Cl. ........................ 118/733; 118/719; 29/401.1; 204/298.25; 414/217; 414/939
[58] Field of Search ................. 29/743, DIG. 44, 29/428, 469, 525.01, 888.3, 401.1; 414/217, 939; 251/361; 137/527; 118/719, 733; 204/298.25

[56] References Cited

U.S. PATENT DOCUMENTS

| | | | |
|---|---|---|---|
| 4,116,419 | 9/1978 | Diehl et al. . | |
| 4,257,447 | 3/1981 | Clarkson . | |
| 4,534,389 | 8/1985 | Tullis | 141/98 |
| 4,616,683 | 10/1986 | Tullis et al. | 141/98 |
| 4,674,939 | 6/1987 | Maney et al. | 414/292 |
| 4,724,874 | 2/1988 | Parikh et al. | 141/98 |
| 4,917,556 | 4/1990 | Stark et al. | 414/217 |
| 5,020,776 | 6/1991 | Owens et al. | 251/327 |
| 5,076,205 | 12/1991 | Vowles et al. | 118/719 |
| 5,143,348 | 9/1992 | Baker et al. . | |
| 5,286,296 | 2/1994 | Sato et al. | 414/217 |
| 5,478,195 | 12/1995 | Usami | 414/786 |
| 5,601,686 | 2/1997 | Kawamura et al. | 156/643.1 |
| 5,640,751 | 6/1997 | Faria . | |
| 5,653,565 | 8/1997 | Bonora et al. | 414/411 |
| 5,655,277 | 8/1997 | Galdos et al. | 29/33 |
| 5,695,564 | 12/1997 | Imahashi | 414/217 |
| 5,730,801 | 3/1998 | Tepman et al. | 118/719 |
| 5,746,434 | 5/1998 | Boyd et al. | 277/1 |

FOREIGN PATENT DOCUMENTS

| | | |
|---|---|---|
| 0 453 867 A1 | 10/1991 | European Pat. Off. . |
| 0 640 784 A1 | 3/1995 | European Pat. Off. . |
| 4-157749 | 5/1992 | Japan ................... 414/939 |
| 4-162709 | 6/1992 | Japan ................... 414/939 |

*Primary Examiner*—David P. Bryant
*Attorney, Agent, or Firm*—Thomason Moser & Patterson

[57] ABSTRACT

A vacuum processing system has a transfer chamber with a slit valve at which is attached a process chamber and with a slit valve insert disposed in the slit valve for matching up with the process chamber. The slit valve may be made of two pieces, an outer portion that slides into the transfer chamber's slit valve opening from the outside of the transfer chamber, and an inner portion that slides into the outer portion from the inside of the transfer chamber. The portions of the insert permit any process chamber to be attached to any slit valve opening. The outer portion may not be removed from the slit valve opening when a process chamber is attached to the transfer chamber, but the inner portion may be easily removed for servicing regardless of in whether a process chamber is attached.

17 Claims, 6 Drawing Sheets

TWO-PIECE SLIT VALVE INSERT FOR VACUUM PROCESSING SYSTEM

FIELD OF THE INVENTION

This invention relates generally to slit valve inserts for vacuum chambers. More specifically, this invention relates to slit valve inserts for transfer chambers for handling substrate wafers and to the connection between transfer chambers and other chambers, such as process chambers, and to the servicing of parts in a slit valve insert.

BACKGROUND OF THE INVENTION

Vacuum systems for manufacturing integrated circuits on wafers are generally known. Several vacuum chambers usually comprise a single vacuum system. A vacuum processing system may typically have a centralized vacuum chamber, called a transfer chamber, which may be part of a mainframe. As the name implies, a transfer chamber's primary purpose is to transfer wafers between other chambers. Other chambers may include process chambers, cooldown chambers, buffer chambers and load lock chambers, among others. A vacuum processing system may also have some kind of subsystem, such as a mini-environment, for delivering wafers to the load lock chambers and removing the wafers from the load lock chambers so the wafers can be moved to the next system for additional processing. This transfer chamber plus the peripheral chambers and staging areas are sometimes called a cluster tool.

Access between chambers is provided through a slit valve. A slit valve includes an opening in a chamber where another chamber's slit valve opening is attached in order for wafers, or substrates, to be passed between the two chambers. Typically, a slit valve opening is an elongated rectangle through which a substrate can pass. The match between the slit valves of two chambers must be airtight in order to maintain the vacuum within the system.

A typical transfer chamber has six slit valves since it is passing wafers between other chambers. A process chamber typically only has one slit valve.

The actual opening for a slit valve in the side of some chambers, like a transfer chamber, is typically a generic rectangular hole that doesn't actually match up with the slit valve of any chamber. Thus, a slit valve insert typically is inserted into the transfer chamber's generic opening in order to match the transfer chamber's opening with the process chamber's specific opening. The insert has an opening matching the process chamber to which it is to be attached. In other words, a slit valve insert is an adapter between chambers.

Additionally, different process chambers have openings of different shapes and sizes. Therefore, different slit valve inserts may be used in the same transfer chamber's slit valve openings.

FIG. 1 shows an example of a slit valve insert 2 immediately before it is inserted into or after it is removed from slit valve opening 26 of transfer chamber 12. Insert 2 has an opening 4 through which wafers are passed and a front surface 5 for pressing against a process chamber. The process chamber will have a wafer-access opening, or slit valve opening, matching opening 4 and usually forms an airtight seal with a surface around its wafer-access opening that matches front surface 5. Insert 2 also has a channel 6 around the opening 4. Channel 6 aligns with a mating surface on the process chamber and holds an O-ring for sealing with the process chamber.

Slit valve inserts have been inserted into a transfer chamber's openings from the outside of the chamber as shown by FIG. 1. The process chamber is then attached over the insert and holds the insert firmly in place. The slit valve provides access between chambers. An actuating cylinder disposed through the floor of the transfer chamber closes the slit valve with a slit valve door that seats on a surface around the slit valve opening. The seat for the door is disposed within the transfer chamber. The slit valve opening, insert, door and actuating cylinder form the slit valve.

The opening and closing cycles of the slit valve will slowly cause the door and the insert to wear out or become dirty or contaminated. A worn out or dirty door or insert may lead to leaks between the transfer chamber and the process chamber, perhaps allowing toxic gases to escape from the process chamber to the transfer chamber or allowing gases from the transfer chamber to enter the process chamber and reduce the process chamber's vacuum capability. A problem occurs if a slit valve insert becomes dirty and needs to be cleaned or becomes worn out and needs to be replaced. Since the inserts are mounted between the transfer chamber and the process chambers from the outside of the transfer chamber, the process chambers have to be completely removed to replace the inserts. Removing and reattaching a process chamber can be a very time-consuming task.

One solution would be to have the inserts inserted from the inside of the transfer chamber because then the chamber openings would have to be redesigned in order to provide such access and in order to make sure that the insert will still form a proper airtight seal with the process chamber. One difficulty with a redesign to accommodate inserting an insert from the inside of the chamber would require that the shoulder used to stop the insert after it has slid into the opening be machined from the inside of the transfer chamber, a very difficult process.

Thus, a need has arisen for a vacuum manufacturing system with a transfer chamber that has a slit valve insert that can be selected to attach to any process chamber and that can be serviced from the inside of the transfer chamber without redesigning the chamber.

SUMMARY OF THE INVENTION

A method of connecting a process chamber to a transfer chamber in one embodiment includes selecting an adapter, or slit valve insert, to match the process chamber, inserting the adapter into the slit valve of the transfer chamber and attaching the process chamber to the transfer chamber. The adapter may have an outer portion inserted into the transfer chamber from the outside of the chamber and an inner portion, having a valve seat formed thereon, inserted into the outer portion from the inside of the chamber. This two-piece slit valve construction enables easy removal and replacement of the inner slit valve insert portion.

A method of replacing process chambers on a transfer chamber in one embodiment involves selecting a matching adapter for the first process chamber and inserting it into the transfer chamber before attaching the first chamber, then detaching the first chamber and removing the adapter, then selecting a matching adapter for another process chamber, and attaching the adapter and chamber as above. The adapter may have inner and outer inserts to be matched to the process chamber.

A vacuum system in one embodiment has two or more chambers with passageways, or slit valves, between them to pass wafers, and adapters, or slit valve inserts, disposed in the passageway of at least one of the chambers to match up the passageways of each chamber. The adapters, or slit valves, may be made of two pieces, each piece separately comprising part of the passageway.

One embodiment of a vacuum chamber has a slit valve with two inserts, selected according to the type of attachment interface on the chamber that is to be attached to it.

An embodiment of a transfer chamber has an adapter disposed in a slit valve opening that can be removed and replaced with another adapter. The adapters attach to different matching process chambers and have inner and outer portions. The outer portion may not be removed from the transfer chamber when the process chamber is attached, and the inner portion can be removed when the process chamber is attached.

One embodiment of an adapter for connecting a process chamber to a transfer chamber has an outer portion that inserts into the transfer chamber and an inner portion that inserts into the outer portion. The inner portion may slide partially into the outer portion, have a passageway that matches with a process chamber, and have a seating surface for forming a seal.

One embodiment of a method for forming an airtight seal between a process chamber and a transfer chamber involves inserting an outer adapter into the transfer chamber, then attaching the process chamber so that it contacts the outer adapter, then inserting an inner adapter into the outer adapter from inside the transfer chamber, and then applying a pressure to bias the inner adapter to the outer adapter.

One embodiment of a method of servicing a transfer chamber without removing a process chamber attached thereto involves opening the transfer chamber, unsealing and removing an inner adapter from an opening between the transfer chamber and the process chamber, and cleaning or replacing the adapter.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENTS

Figure 1:
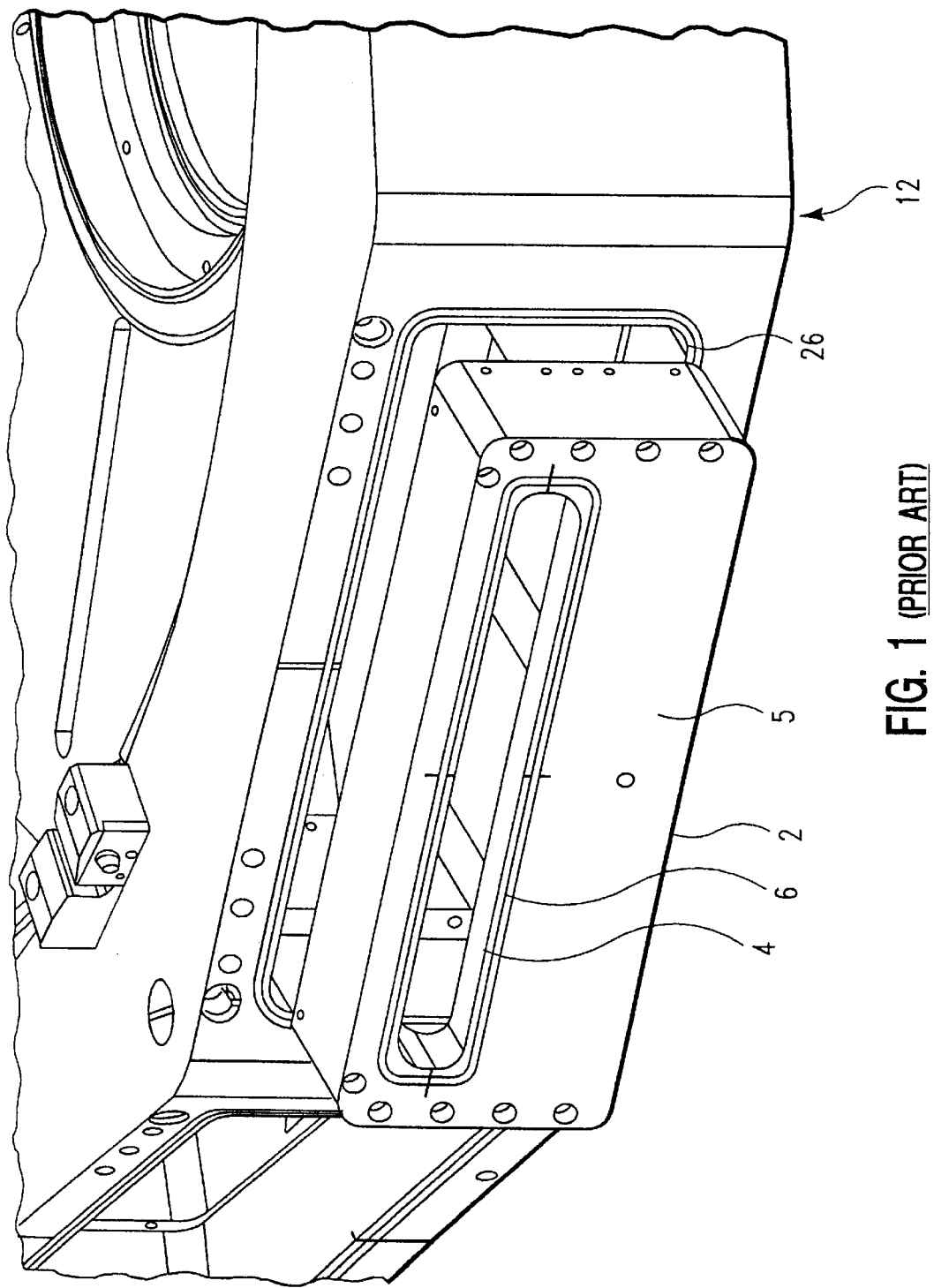
FIG. 1 is a perspective view of a cut-away portion of a transfer chamber without a lid showing a prior art slit valve insert exploded from the slit valve.
Figure 2:
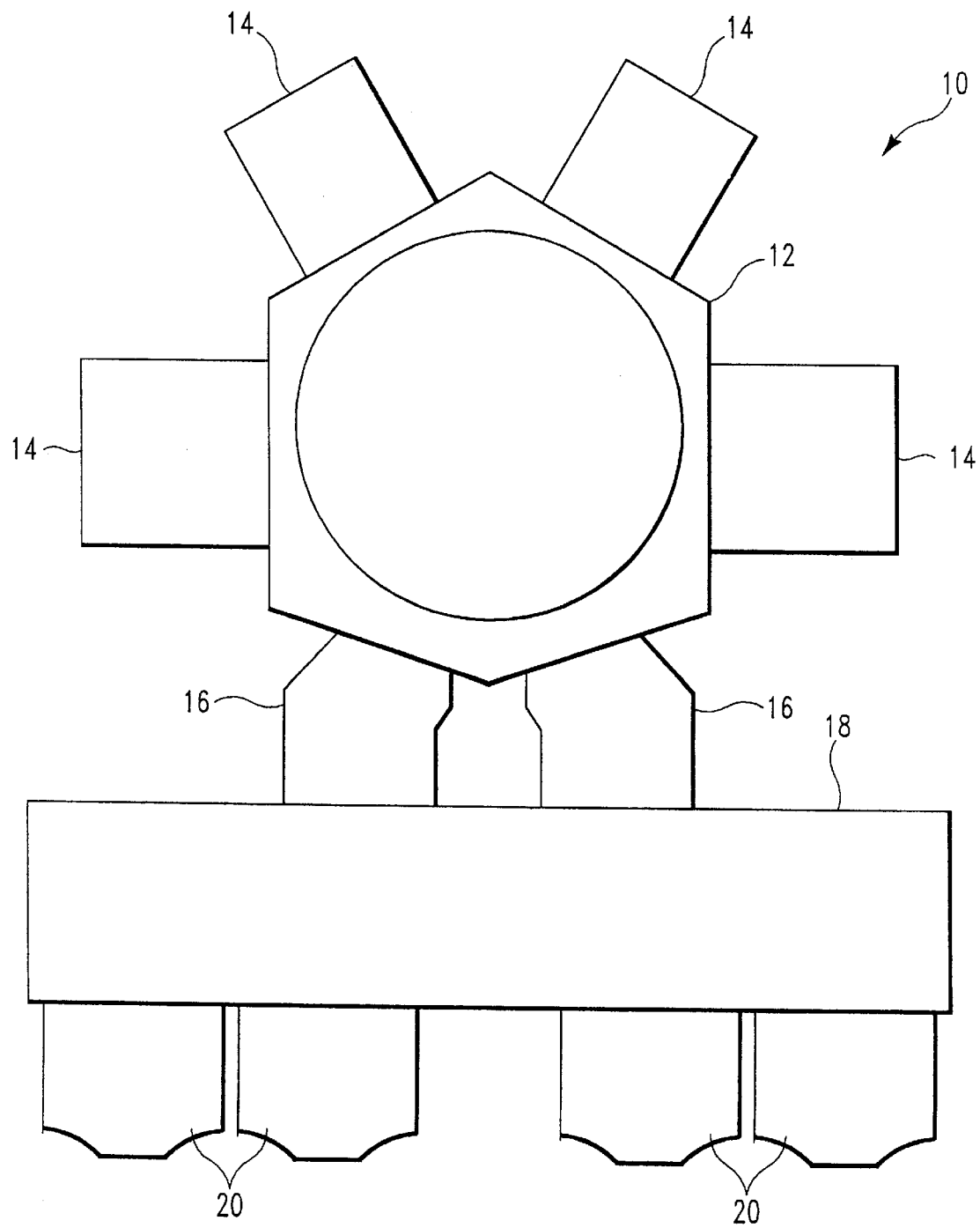
FIG. 2 is a schematic of a vacuum manufacturing system.

FIG. 2 is a top schematic view of a vacuum processing system 10 generally showing a series of vacuum chambers 14 attached to a central vacuum transfer chamber 12. A pair of vacuum load lock chambers 16 are shown providing a passageway to a mini-environment 18. Pod loaders 20 are shown attached to the mini-environment 18. This system is an example of a cluster tool.

In this arrangement, the vacuum chambers 14 may be connected to the transfer chamber 12 at an airtight seal which permits wafers to pass between the two chambers 12, 14, 16 without losing the vacuum in the chambers 12, 14, 16.

The pod loaders 20 are attached to the mini-environment 18 and may be loaded with wafer cassettes by a person or by an automated machine that is part of the over-all automated manufacturing system of the manufacturing plant or building that houses the vacuum processing system 10. A robot (not shown) within the mini-environment 18 may move the wafers from the pod loaders 20 to the load lock chambers 16 and back again. A robot (not shown) with an arm and a blade for moving wafers within transfer chamber 12 may move the wafers from one of the load lock chambers 16 to the process chambers 14 and back to one of the load lock chambers 16.

Vacuum chambers 14 may be any of several types of process chambers, such as a chemical vapor deposit on (CVD) chamber, a physical vapor deposition (PVD) chamber, an etch chamber, etc., for performing on a wafer some type of process in a series of many processes for manufacturing integrated circuits on wafers. It is not unusual for a manufacturer of vacuum chambers to have over twenty different types of such process chambers, each with some common features, but for performing different processes on the wafers.

Figure 3:
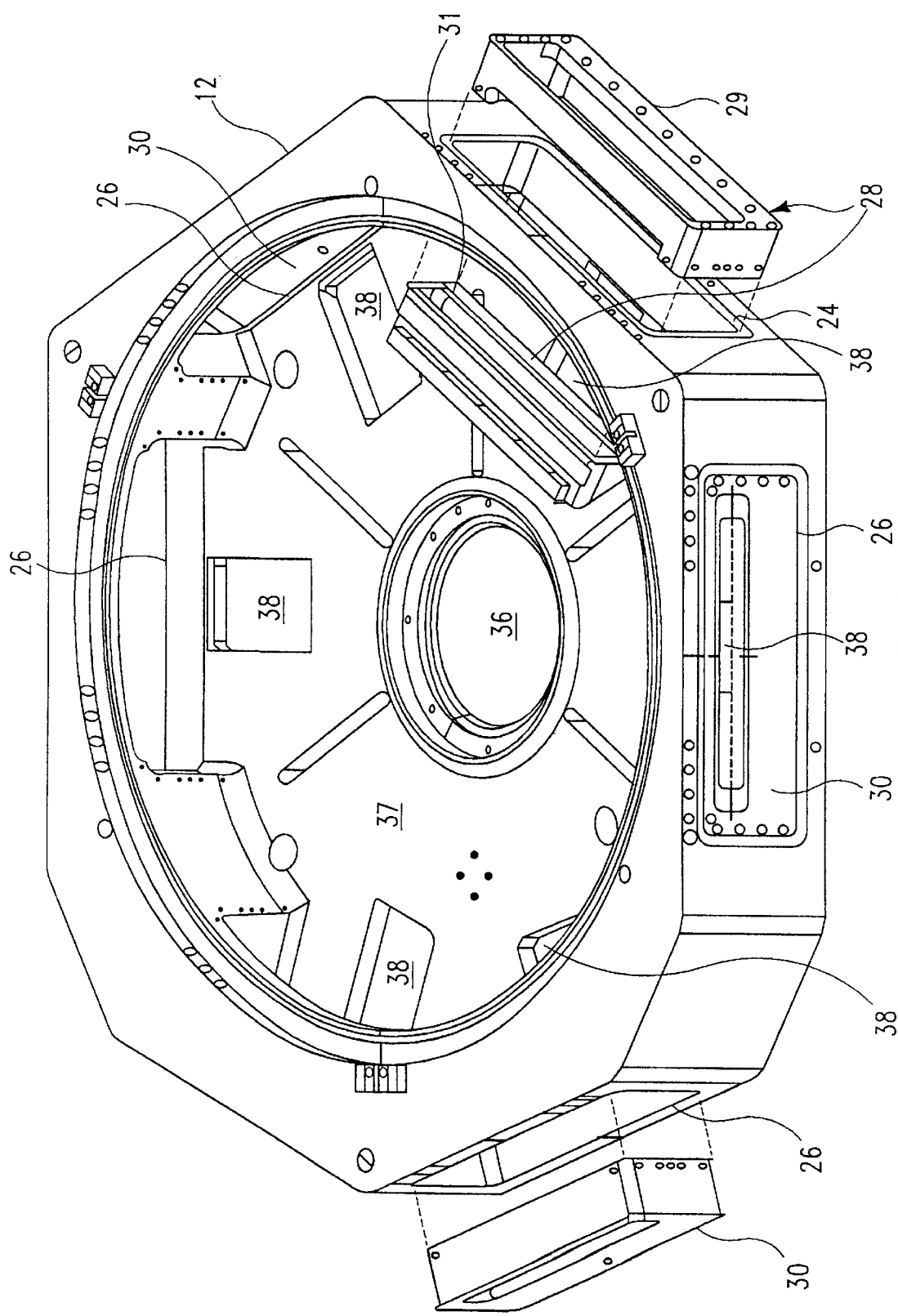
FIG. 3 is a perspective view of a transfer chamber with the lid removed and slit valve inserts shown in the transfer chamber and exploded from the transfer chamber.

FIG. 3 is a perspective view of an exemplary transfer chamber 12 with the lid removed so that the interior of the transfer chamber 12 is visible. Several slit valves with openings 24, 26 and examples of slit valve inserts 28, 30 are shown. The slit valve openings 24, 26 and the slit valve inserts 28, 30 form the slit valves. Slit valve inserts 28, 30 are adapters for permitting a process chamber 14 to be attached to the transfer chamber 12 with a passageway for wafers formed therebetween. The process chamber 14 is attached with an airtight seal to the transfer chamber 12 to prevent atmosphere from entering the vacuum system at the chamber-to-chamber connection. Different slit valve inserts 28, 30 are adapted to match up with different types of process chambers 14. Circular opening 36 in the floor 37 of transfer chamber 12 normally supports a robot with an arm for moving wafers inside the transfer chamber 12 and into and out of the other chambers 14, 16 connected thereto. The robot is not shown in this drawing so other details of the transfer chamber interior may be visible. Rectangular openings 38 provide access for an actuating cylinder for manipulating a slit valve door to apply a biasing pressure to open or close the slit valve door. There is one opening 38 for each slit valve. The actuating cylinders and the slit valve doors are not shown so that other features in the transfer chamber 12 may be visible. An example of an actuating cylinder and slit valve door may be seen in U.S. Pat. No. 5,226,632, issued Jul. 13, 1993, and incorporated herein by reference as if fully set forth below.

Two-piece slit salve 28 is shown exploded from the slit valve opening 24 on the outside and the inside of the transfer chamber 12. Outer portion 29 slides into opening 24 from the outside of the transfer chamber 12, and inner portion 31 slides into the outer portion 29 from the inside of the transfer chamber 12. The outer portion 29 is attached to the transfer chamber 12 and the inner portion is attached to the outer portion 31, both by any appropriate means such as by screws. In this manner, a process chamber 14 may be mounted to the outside of transfer chamber 12 at the slit valve opening 24 and may, thereby, keep outer portion 29 trapped in place. Inner portion 31, however, can still be removed through the inside of transfer chamber 12, even when a process chamber 14 is attached. To remove the inner portion 31, all that is required is to pull the actuating cylinder and slit valve door back away from the inner portion 31, open the transfer chamber lid, disconnect the inner portion 31 and pull the inner portion 31 out. Thus, the inside of the slit valve insert 28 may be serviced, cleaned or replaced without detaching the process chamber 14 from the transfer chamber.

Figure 4:
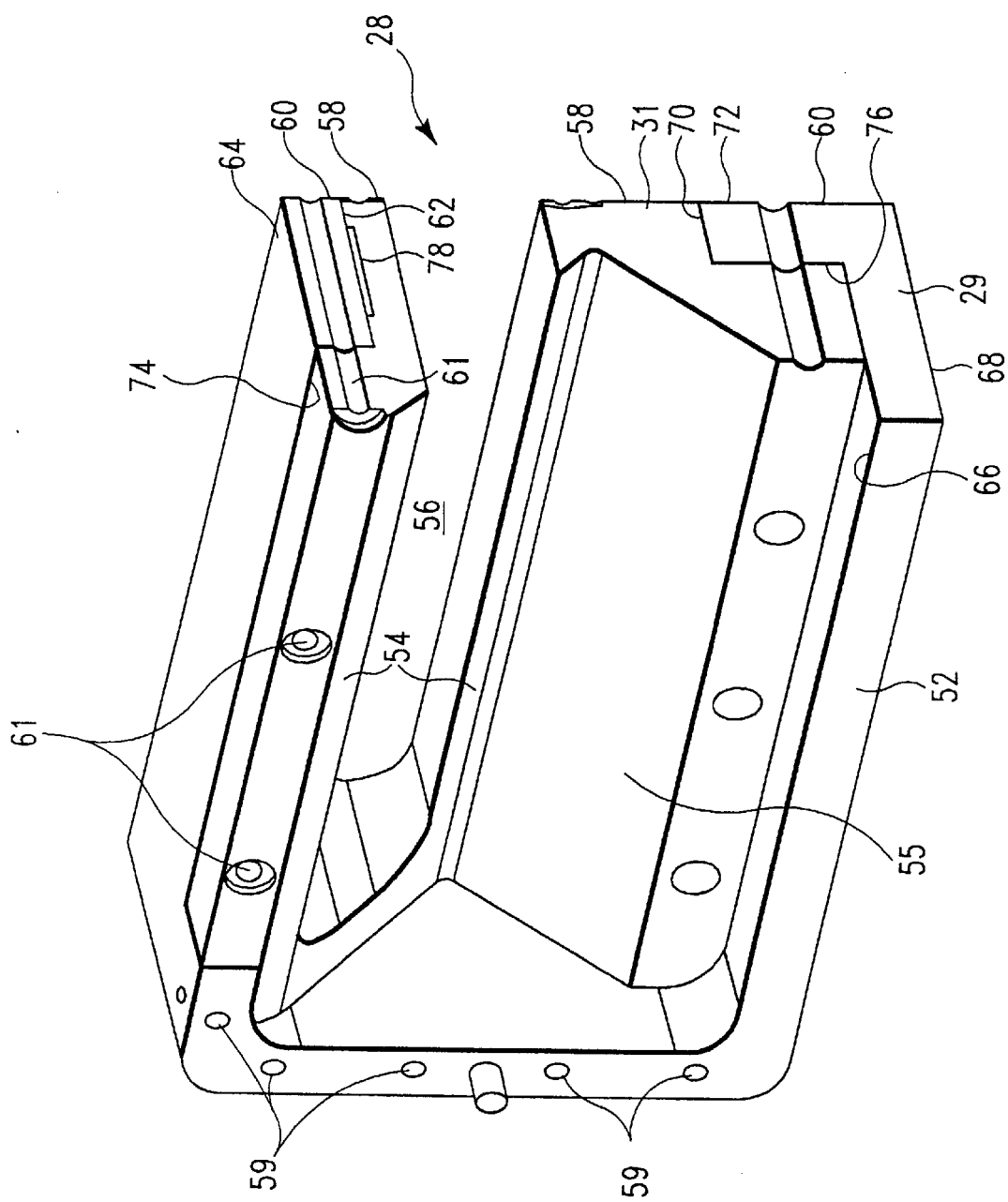
FIG. 4 is a perspective view of a cut-away section of a two-piece slit valve insert.

FIG. 4 is a cut-away view of one example of a slit valve insert 28. The right end of slit valve insert 28 has been cut away to show the interior section and for enlargement purposes. Rear surface 52 of outer portion 29 faces the interior of the transfer chamber 12. Rear angular surface 54 of inner portion 31 faces toward the interior of the transfer chamber 12, but at a downward angle, and forms a slit valve door seat, so that a slit valve door may be pushed up at an angle from the floor of the transfer chamber and form an airtight seal with surface 54 to close the slit valve. Opening 56 is the actual opening between the transfer chamber 12 and a process chamber 14 when the slit valve door is pulled back. The opening 56 may be made for varying substrate sizes, e.g. 600 mm, 300 mm, 200 mm, etc. Rear sloped surface 55 is downwardly sloping to allow the slit valve door to contact seating surface 54. An alternative door/seat combination (not shown) actuates a door by moving it almost horizontally from its seat and then lowers the door. Thus, the alternative is a two-step motion, and has a slit valve insert with an almost vertical rear surface for the slit valve door seat.

The outer portion 29 attaches to the transfer chamber 12 with screws through holes 59. The inner portion 31 slides into the outer portion 29 along the bottom surface 62 of the top wall 64 of the outer portion 29, the top surface 66 of the bottom wall 68 of the outer portion 29 and the top face 70 of the front wall 72 of the outer portion 29. The inner portion 31 slides into an almost rectangular opening in outer portion 29 until its front face 58 is almost flush with the front face 60 of the outer portion 29. The inner portion 31 is attached to the outer portion 29 with screws in holes 61, an(d the screws arc tightened until the front face 58 of the inner portion 31 bottoms out on the outer surface of the attached process chamber. Thus, although the inner portion 31 has outer surfaces that correspond with the inner surfaces 62, 66, 70, 74, 76 of the outer portion 29, the two portions 29, 31 don't necessarily touch along each of these surfaces, such that a very small Rap may occur between the inner and outer portions. However, when the slit valve door is biased against surface 54, inner portion 31 is forced forward and upward, so the inner portion 31 is not only pressed harder against the outer surface of the attached process chamber, but it is also pressed against the outer portion 29 at surface 62. The contact at the surface 62 may capture a small amount of gas. To minimize the amount of gas captured at this contact and to minimize the contact surface, space 78 runs the length of the contact and is vented to the transfer chamber 12.

Figure 5:
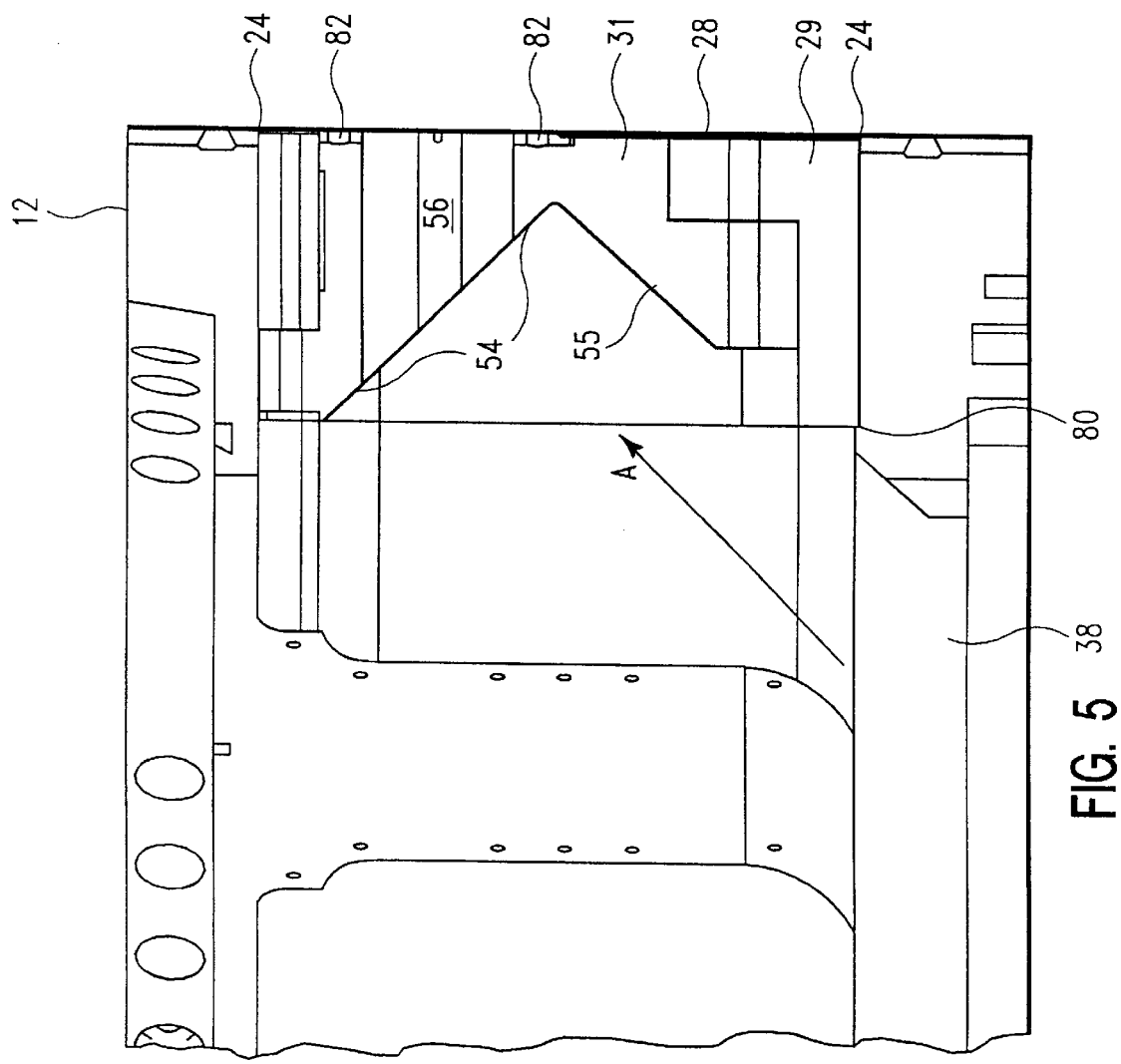
FIG. 5 is a cross section view of a cut-away portion of a transfer chamber showing a two-piece slit valve insert in its operational position.

FIG. 5 is a cut-away cross section view of a transfer chamber 12 without a lid showing part of the inside of the transfer chamber 12 and the position of the insert 28 in the valve opening 24. Outer portion 29 slides into the valve opening 24 from the outside of transfer chamber 12 and stop at shoulder 80. Inner portion 31 slides into the outer portion 29 from the inside of the transfer chamber 12. The actuating cylinder is mounted in opening 38 and pushes the valve door in the direction of arrow A against surface 54 to close opening 56. Inner portion 31 is thus pressed against the outer surface of the attached process chamber such that an O-ring (not shown) disposed within groove 82 forms a seal with the surface of the process chamber. This seal, in combination with a seal by the valve door over opening 56, forms an airtight seal for the differential pressure between the transfer chamber 12 and the process chamber 14. A process chamber has its own pass through opening, and each type of chamber may have a slightly different size opening and a slightly different interface for attaching to the outside of transfer chamber 12 and mating, up with an O-ring (not shown) disposed within groove 83. It is this O-ring that makes the airtight seal described earlier between the transfer chamber 12 and the process chamber 14.

Figure 6:
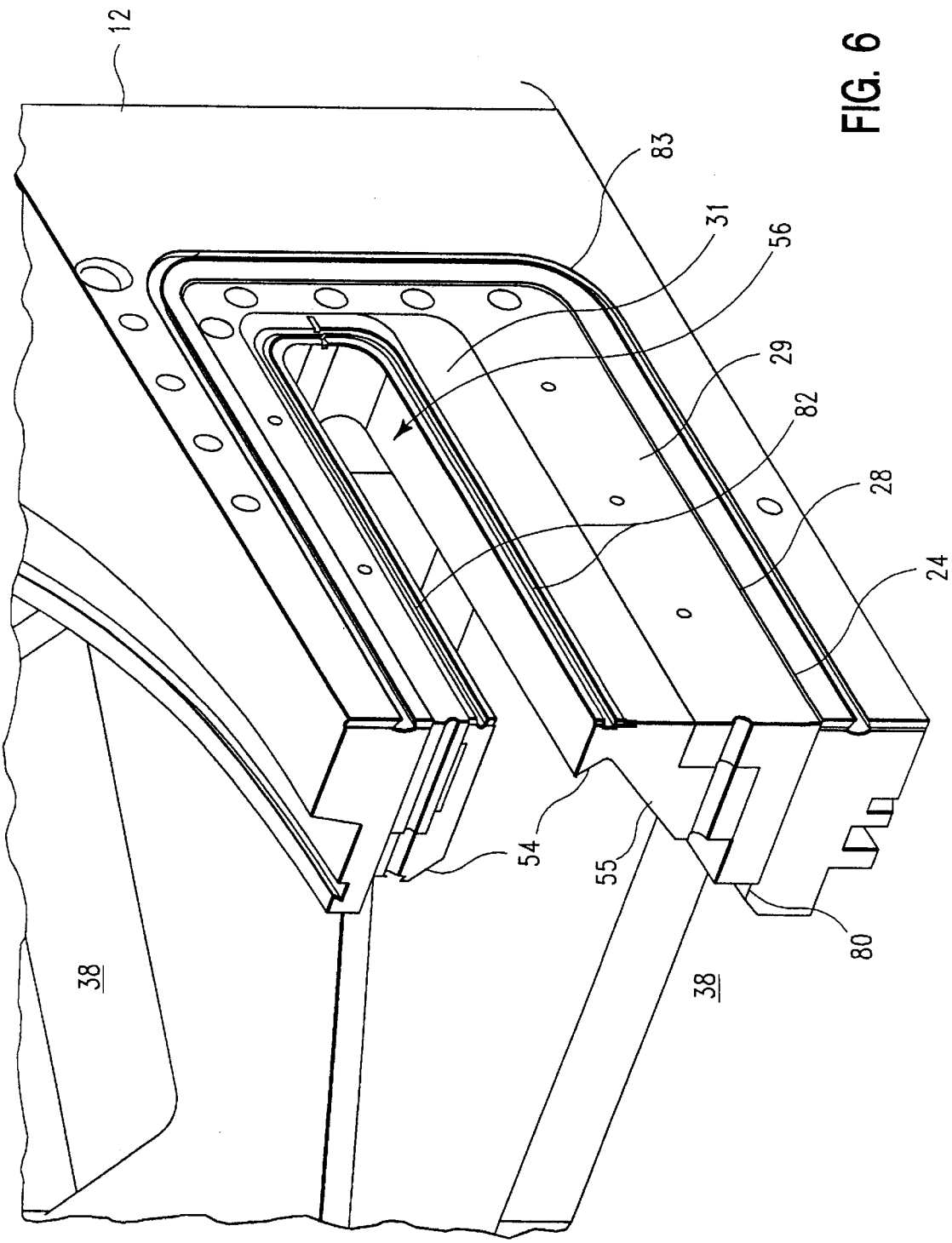
FIG. 6 is a perspective view of a cut-away portion of a transfer chamber showing a two-piece slit valve insert in its operational position.

FIG. 6 is a cut-away perspective view of part of a transfer chamber 12 showing much of the same features as in FIG. 5, but from a different angle for additional clarity.

By selecting the appropriate inner and outer portions 31, 29 to match a process chamber 14, the slit valve 24, 28 is attachable to any process chamber. Thus, in this embodiment, a user selects the appropriate inner and outer portions 31, 29 to match the chamber 14, slides the selected outer portion 29 into the valve opening 24, attaches the outer portion 29 to the transfer chamber 12, attaches the process chamber 14 to the transfer chamber 12, slides the selected inner portion 31 into the outer portion 29, and then connects the inner portion 31 to the outer portion 29. Likewise, when a currently attached process chamber 14 is to be replaced, the user needs only to select a different inner and outer portion 31, 29. Also, when the inner portion 31 needs to be cleaned or replaced, it is not necessary to remove the process chamber 14 and the outer portion 29, so service is very quick and easy for the inner portion 31, but the outer portion 29 may not be removed without detaching the process chamber 14.

Each of the valve openings 24, 26 on a transfer chamber 12 may have the same type of process chamber 14 attached, requiring the same type of two-piece insert 28, or they may have different types of process chamber 14 requiring different two-piece inserts 28 for each valve opening 24, 26.

While the foregoing is directed to the preferred embodiment of the present invention, other and further embodiments of the invention may be devised without departing from the basic scope thereof, and the scope thereof is determined by the claims which follow.

We claim:

1. A slit valve adapter for matching a first vacuum chamber opening with a second vacuum chamber opening, comprising:
    a first portion for inserting into the first vacuum chamber opening; and
    a second portion for inserting into the first portion and including a valve door seating surface; wherein the adapter defines a transfer passageway providing communication between the first vacuum chamber and the second vacuum chamber.

2. The adapter of claim 1, wherein the second portion defines the transfer passageway.

3. The adapter of claim 1, wherein the first vacuum chamber is a transfer chamber.

4. The adapter of claim 1, wherein the second portion is at least slidably disposed in the first portion and is secured thereto by fasteners.

5. The adapter of claim 1, further comprising a slit valve door to selectively engage the valve door seating surface and seal the first vacuum chamber from the second vacuum chamber.

6. The adapter of claim 1 further comprising cooperating holes in each of the first and second portions to enable selective coupling of the first and second portions by inserting fasteners through the holes.

7. A slit valve adapter for matching a transfer chamber opening with a process chamber opening, the adapter comprising:
- an outer portion for inserting into the transfer chamber opening; and
- an inner portion for inserting into the outer portion; wherein the outer portion and the inner portion have substantially conforming, corresponding sliding surfaces, whereby the inner portion slides into the outer portion; wherein the inner portion includes a valve door seating surface.

8. The adapter of claim 7 wherein:
the inner portion includes an opening for matching with the process chamber opening.

9. The adapter of claim 7 wherein:
the valve door seating surface is an angled rear surface for receiving a biasing pressure for forming an airtight seal.

10. The adapter of claim 7 wherein:
the outer portion is a substantially rectangular block and includes:
- a substantially planar front face;
- a substantially planar rear face;
- a substantially rectangular hole extending from the rear face to the front face;
- a bottom wall having a top surface defining a bottom wall of the substantially rectangular hole;
- a front wall extending partially along the front face upwardly from the bottom wall, the front wall having a top face and an inner rear face; and
- a top wall having a substantially rectangular cut-out extending forwardly from the rear face and having a bottom surface, the cut-out defining an inward rear face of the top wall; and the inner portion includes:
- a substantially planar front face, the front face of the inner portion being substantially flush with the front face of the outer portion;
- an upper angled rear face;
- a substantially rectangular hole extending from the upper angled rear face to the front face of the inner portion;
- a lower angled rear face joining the upper angled rear face at an inner angle; and
- a multiplanar outer surface that substantially conforms to the bottom surface and the inward rear face of the top wall of the outer portion, to the top surface of the bottom wall of the outer portion, and to the top face and inner rear face of the front wall of the outer portion;

whereby:
the inner portion slides into the outer portion along the bottom surface of the top wall of the outer portion, the top surface of the bottom wall of the outer portion and the top face of the front wall of the outer portion with corresponding conforming outer surfaces of the multiplanar outer surface of the inner portion.

11. The adapter of claim 7, wherein the adapter defines a wafer transfer passageway.

12. The adapter of claim 7 further comprising cooperating holes in each of the inner and outer portions to enable selective coupling of the inner and outer portions by inserting fasteners through the holes.

13. The adapter of claim 7 wherein the transfer chamber includes a valve door disposed therein to selectively engage the valve door seating surface and seal the process chamber from the transfer chamber.

14. A slit valve adapter for matching a first chamber opening with a second chamber opening, the adapter comprising:
- an outer portion for inserting into the first chamber opening, the outer portion comprising:
  - a first front face;
  - a rear face; and
  - an inner surface defining an opening extending between the first front face and the rear face; and
- an inner portion at least partially slidably disposed on the inner surface of the outer portion, comprising:
  - a second front face, the second front face and the first front face defining a substantially planar front surface;
  - a rear valve door seating surface; and
  - a transfer passageway extending between the second front face and the rear seating surface.

15. The adapter of claim 14 further comprising a seal disposed on the second front face.

16. The adapter of claim 14 further comprising cooperating holes in each of the inner and outer portions to enable selective coupling of the inner and outer portions by inserting fasteners through the holes.

17. The adapter of claim 14 wherein a first chamber having the first chamber opening formed therein includes a valve door disposed therein to selectively engage the valve door seating surface and seal the first chamber from a second chamber having the second chamber opening formed therein.

* * * * *

UNITED STATES PATENT AND TRADEMARK OFFICE
CERTIFICATE OF CORRECTION

PATENT NO. : 6,045,620
DATED : April 4, 2000
INVENTOR(S) : Tepman et al.

Page 1 of 1

It is certified that error appears in the above-identified patent and that said Letters Patent is hereby corrected as shown below:

Column 5,
Line 18, before "surface", please insert -- seating --.
Line 50, plaese replace "Rap" with -- gap --.

Column 6,
Line 12, after "mating" please delete ",".

Signed and Sealed this

Thirty-first Day of July, 2001

*Attest:*

*Nicholas P. Godici*

*Attesting Officer*

NICHOLAS P. GODICI
*Acting Director of the United States Patent and Trademark Office*